(12) United States Patent
Takahashi et al.

(10) Patent No.: US 6,423,598 B1
(45) Date of Patent: Jul. 23, 2002

(54) SEMICONDUCTOR DEVICE, A METHOD OF MANUFACTURING THE SAME, AND A SEMICONDUCTOR DEVICE PROTECTIVE CIRCUIT

(75) Inventors: Hideki Takahashi, Tokyo; Shuuichi Tominaga, Fukuoka, both of (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/555,522

(22) PCT Filed: Oct. 8, 1998

(86) PCT No.: PCT/JP98/04556

§ 371 (c)(1),
(2), (4) Date: Jun. 8, 2000

(87) PCT Pub. No.: WO00/21140

PCT Pub. Date: Apr. 13, 2000

(51) Int. Cl.⁷ .................. H01L 21/336; H01L 21/8222; H01L 21/331; H01L 29/74; H01L 29/47

(52) U.S. Cl. ................ 438/281; 438/328; 438/372; 257/109; 257/471

(58) Field of Search .................. 438/281, 328, 438/336, 309, 356, 372, 571; 257/267, 483, 484, 486, 492, 109, 471, 475

(56) References Cited

U.S. PATENT DOCUMENTS

| 4,110,775 | A | * | 8/1978 | Festa ........................ 357/15 |
| 4,717,678 | A | * | 1/1988 | Goth ......................... 437/27 |
| 4,999,318 | A | * | 3/1991 | Takahumi et al. .......... 437/194 |
| 5,608,244 | A | * | 3/1997 | Takahashi ................... 257/267 |
| 5,679,586 | A | * | 10/1997 | Rodrigues et al. ........... 437/31 |
| 5,969,400 | A | * | 10/1999 | Shinohe et al. ............. 257/492 |
| 6,184,545 | B1 | * | 2/2001 | Werner et al. .............. 257/109 |
| 6,229,193 | B1 | * | 5/2001 | Bandic et al. .............. 257/486 |

* cited by examiner

*Primary Examiner*—John F. Niebling
*Assistant Examiner*—Walter L. Lindsay, Jr.
(74) *Attorney, Agent, or Firm*—Oblon, Spivak, McClelland, Maier & Neustadt, P.C.

(57) ABSTRACT

A Schottky diode which provides a structure having no P-N junction while improving voltage resistance against a reverse bias when employed in combination with an insulated gate semiconductor device in particular. In order to attain the aforementioned object, a P-type impurity region having a surface exposed on a surface of an N-type semiconductor substrate functioning as a drain for functioning as a channel region and a gate insulator film covering it are provided. A gate electrode is extended from above the gate insulator film over a first taper of an oxide film. In a Schottky diode rendering the semiconductor substrate a cathode and having a boundary layer as a Schottky region, on the other hand, an anode electrode is extended from above the boundary layer over a second taper of the oxide film existing above an end portion of the boundary layer.

19 Claims, 11 Drawing Sheets

F I G. 7
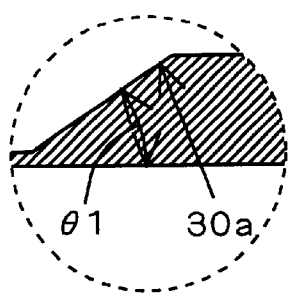
F I G. 8
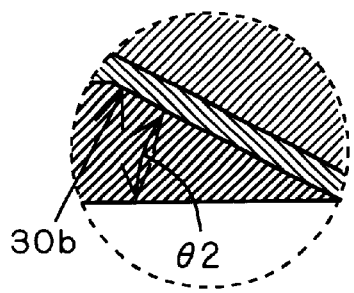
F I G. 9
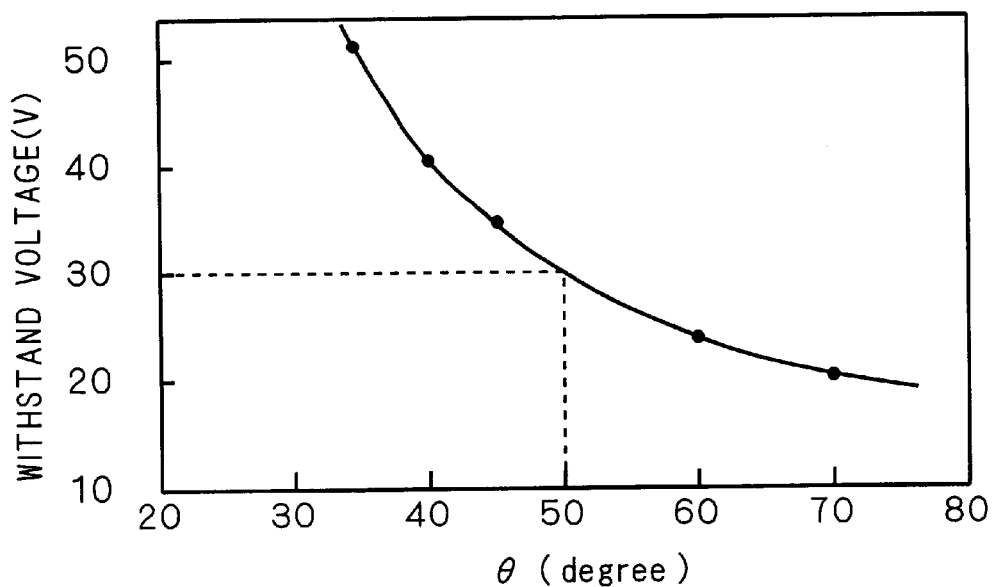

SEMICONDUCTOR DEVICE, A METHOD OF MANUFACTURING THE SAME, AND A SEMICONDUCTOR DEVICE PROTECTIVE CIRCUIT

BACKGROUND OF THE INVENTION

1. Field of the Invention

The present invention relates to a Schottky diode having a structure for improving a reverse bias characteristic in particular, and more particularly, it relates to a Schottky diode employed in combination with an insulated gate semiconductor device. It also relates to a technique of protecting an insulated gate semiconductor device.

2. Discussion of the Background

FIG. 16 and FIG. 17 are sectional views showing the structures of conventional Schottky diodes 100 and 101 respectively. In each of the Schottky diodes 100 and 101, an oxide film 35 is selectively formed on an N⁻-type semiconductor substrate 11, and a boundary layer 14 called a Schottky region is provided on a surface of the semiconductor substrate 11 not formed with the oxide film 35. The boundary layer 14 can be formed by diffusing platinum into the surface of the semiconductor substrate 11, for example. An anode electrode 51 is in contact with the boundary layer 14 and provided on its upper portion while covering part of the oxide film 35.

In the Schottky diode 101, a P-type impurity region 15 extending over the oxide film 35 and the boundary layer 14 is further provided in the surface of the semiconductor substrate 11. This functions as a guard ring controlling the shape of a depletion layer and preventing an electric field from concentrating to the boundary layer 14 and reducing voltage resistance when a reverse bias is applied to the Schottky diode 101. Hence the voltage resistance of the Schottky diode 101 becomes higher than the voltage resistance of the Schottky diode 100.

In the case of applying a prescribed anode voltage $V_{AK}$ between the anode electrode 51 and the semiconductor substrate 11 as a forward bias, the Schottky diode 100 or 101 forwardly conducts when the anode voltage $V_{AK}$ exceeds a certain threshold. The threshold voltage at this time depends on the barrier height of the formed boundary layer 14. In general, the threshold voltage of a Schottky diode is desirably low for reduction of power consumption, and set to about 0.3 V, for example. In the Schottky diode 101, therefore, the threshold voltage of a P-N junction, which becomes about 0.6 V, formed by the impurity region 15 and the semiconductor substrate 11 does not inhibit the Schottky diode 101 from turning ON.

When applying a voltage becoming a reverse bias between the anode electrode 51 and the semiconductor substrate 11, on the other hand, no current flows in the Schottky diode 100 or 101 up to a breakdown voltage of a junction formed by the boundary region 14 and the semiconductor substrate 11 except a leakage current.

In order to reduce the cost, it is also possible not to form the boundary region 14 in the Schottky diode 100 but form the anode electrode 51 by an aluminum alloy, for example, and employ silicon as the semiconductor substrate 11 for structuring a diode. In this case, aluminum contained in the anode electrode 51 diffuses into the surface of the semiconductor substrate 11, whereby the conductivity type of a region in the semiconductor substrate 11 being in contact with the anode electrode 51 becomes a P⁻ type. The barrier height is low as compared with a general diode comprising a P-N junction, whereby the threshold is also small and a diode having characteristics approximate to a Schottky diode can be obtained. A diode of such a structure is tentatively referred to as "pseudo Schottky diode" in this specification.

FIG. 18 is a circuit diagram showing the structure of a circuit 400 sensing, when an overcurrent flows in an insulated gate transistor such as an IGBT 21, for example, the current and protecting the IGBT 21. The gate and the collector of a current detection IGBT 22 are connected to the gate and the collector of the IGBT 21 respectively. A power source 23 applying a voltage becoming a forward bias is provided between the collector and the emitter of the IGBT 21. An end of a resistor 24 is connected to the gates of the IGBTs 21 and 22, and the IGBTs 21 and 22 are driven under the control of a driving circuit (not shown) connected to the other end of the resistor 24.

A current detection part 25 is connected between the gate and the emitter of the IGBT 22. The current detection part 25 is formed by a resistor 26, a Schottky diode 27 and a MOSFET 28. The resistor 26 is connected between the emitter of the IGBT 22 and the emitter of the IGBT 21, while the anode of the Schottky diode 27 is connected to the gates of the IGBTs 21 and 22 and the cathode is connected to the drain of the MOSFET 28 respectively. The source of the MOSFET 28 is connected to the emitter of the IGBT 21 and the gate is connected to the emitter of the IGBT 22 respectively.

Regarding the IGBT 21 as a body and the IGBT 22 as that for current detection in general, the two are generally structured in a combined manner. The structure of the circuit 400 in such a case is disclosed in Japanese Patent Laying-Open Gazette No. 8-148675, for example.

Depending on a current flowing in the IGBT 21, a current flows also in the IGBT 22, and the latter current develops a voltage drop in the resistor 26. When this voltage drop exceeds the threshold of the gate of the MOSFET 28, the MOSFET 28 turns on and a current flows from the resistor 24 through the Schottky diode 27 and the MOSFET 28. Hence the gate potential of the IGBT 21 lowers, and it follows that the current flowing therein is suppressed.

Study is now made as to what kind of characteristics to have as the Schottky diode 27. FIG. 19 is a graph showing the relations between anode voltages $V_{AK}$ and logarithmic values log I of currents I flowing in diodes as to a plurality of types of diodes. A graph 91 shows the characteristic of a diode (hereinafter tentatively referred to as "P-N junction diode") formed by a P-N junction, a graph 92 shows the characteristic of the Schottky diode 100 and the graph 93 shows the characteristic of the pseudo Schottky diode respectively.

The characteristic of the Schottky diode 101 is shown by synthesis of the graph 92 in a region where the anode voltage $V_{AK}$ is lower than branching of a curve 90 shown by a broken line, the curve 90 and the graph 91 in a region where the anode voltage $V_{AK}$ is higher than joining of the curve 90. The reason why the characteristic of the Schottky diode 101 is shown by such a synthesized graph is that the P-N junction formed by the impurity region 15 and the semiconductor substrate 11 does not conduct but is substantially equal to the characteristic of the Schottky diode 100 in a region where the anode voltage $V_{AK}$ is relatively small while this P-N junction forwardly conducts and the characteristic of the diode formed by the P-N junction in which a large current flows becomes dominant in the region where the anode voltage $V_{AK}$ is relatively small.

FIG. 20 is a graph showing a current flowing in the IGBT 21 and a voltage generated between its collector and emitter in the case of employing the Schottky diode 100 as the Schottky diode 27 of the circuit 400 shown in FIG. 18, and units are arbitrary as to both of the current and the voltage. There is shown that a clamp operation as to the current flowing in the IGBT 21 is performed and protection against an overcurrent is normally performed. Both of FIG. 21 and FIG. 22 show operation characteristics of the circuit 400 in the case of employing a pseudo Schottky diode as the Schottky diode 27 and the case of employing the Schottky diode 101 as the Schottky diode 27, and correspond to FIG. 20. There is shown that an oscillation phenomenon takes place although a clamp operation is performed as to the current in each case.

The pseudo Schottky diode and the Schottky diode 101 comprise P-N junctions dissimilarly to the Schottky diode 100. Therefore, it is conceivable that, when a voltage of at least about 0.6 V is applied, the injection rate of holes increases as compared with the Schottky diode 100 and a delay takes place in the operation of the MOSFET 28. It is conceivable that this operation delay of the MOSFET 28 causes the aforementioned oscillation phenomenon.

Thus, when employing the Schottky diode 27 from the conventional Schottky diode, there has been present such a trade-off relation that it is desirable to select the Schottky diode 100 in view of causing no oscillation although it is desirable to select the Schottky diode 101 in the point of voltage resistance in reverse bias application.

In the protection circuit disclosed in Japanese Patent Laying-Open Gazette No. 8-148675, there is shown a structure directly placing an aluminum film on an N⁻ layer as an element corresponding to the Schottky diode 27 of the circuit 400.

SUMMARY OF THE INVENTION

The present invention aims at solving the aforementioned problems and providing a Schottky diode having a structure improving voltage resistance against a reverse bias without having a P-N junction. Further, it also aims at providing a technique making oscillation hardly occur in overcurrent protection of an insulated gate transistor.

A first aspect of a semiconductor device according to the present invention comprises a first semiconductor layer of a first conductivity type, an insulated gate semiconductor device having a second semiconductor layer of a second conductivity type having a surface exposed on a surface of the first semiconductor layer for functioning as a channel region, a gate insulator film provided on the first and second semiconductor layers and a gate electrode provided on the gate insulator film, a Schottky diode having a Schottky region formed in the surface of the first semiconductor layer and an electrode provided on the Schottky region, and an insulator film having a first end portion crowned with the gate electrode continuously with an end portion of the gate insulator film on a side far from the channel region with its film thickness increasing as going away from the channel region and a second end portion crowned with the electrode on an end portion of the Schottky region with its film thickness increasing as going away from the Schottky region.

A second aspect of the semiconductor device according to the present invention is the first aspect of the semiconductor device, and the first semiconductor layer functions as a drain of the insulated gate semiconductor device and a cathode of the Schottky diode.

A third aspect of the semiconductor device according to the present invention is the first aspect of the semiconductor device, and the electrode has a barrier metal on a portion coming into contact with the Schottky region.

A fourth aspect of the semiconductor device according to the present invention is the first aspect of the semiconductor device, and each of the first and second end portions has a taper of not more than 50 degrees.

A fifth aspect of the semiconductor device according to the present invention is the first aspect of the semiconductor device, and the insulator film has a flat portion between the first end portion and the second end portion, the gate electrode is extended from the gate insulator film toward the flat portion via the first end portion, and the electrode is extended from the second end portion toward the flat portion.

A sixth aspect of the semiconductor device according to the present invention is the first aspect of the semiconductor device, and the insulator film encloses the Schottky region.

A seventh aspect of the semiconductor device according to the present invention is the sixth aspect of the semiconductor device, and the gate electrode encloses the Schottky region.

An eighth aspect of the semiconductor device according to the present invention is the first aspect of the semiconductor device, and the insulated gate semiconductor device is a double diffusion insulated gate semiconductor device.

A ninth aspect of the semiconductor device according to the present invention is the eighth aspect of the semiconductor device, and the insulated gate semiconductor device further has a third semiconductor layer of the first conductivity type provided in the surface of the second semiconductor layer for functioning as a source of the insulated gate semiconductor device, while the third semiconductor layer is connected with the gate electrode through a resistor.

A first aspect of a method of manufacturing a semiconductor device according to the present invention comprises (a) a step of preparing a first semiconductor layer of a first conductivity type, (b) a step of forming a second semiconductor layer of a second conductivity type having a surface exposed on a surface of the first semiconductor layer for functioning as a channel region and a gate insulator film on the first and second semiconductor layers, (c) a step of forming a gate electrode on the gate insulator film for forming an insulated gate semiconductor device having the gate electrode and the first and second semiconductor layers, (d) a step of forming a Schottky region in the surface of the first semiconductor layer, (e) a step of forming an electrode on the Schottky region for forming a Schottky diode having the electrode and the Schottky region, and (f) a step of forming an insulator film having a first end portion whose film thickness increases as going away from the channel region in continuation with an end portion of the gate insulator film on a side far from the channel region and a second end portion whose film thickness increases as going away from the Schottky region on an end portion of the Schottky region in advance of the steps (c) and (d).

A second aspect of the method of manufacturing a semiconductor device according the present invention is the first aspect of the method of manufacturing a semiconductor device, and the step (d) has (d-1) a step of introducing an impurity into the surface of the first semiconductor layer (11) while employing the insulator film as a mask.

A third aspect of the method of manufacturing a semiconductor device according to the present invention is the first aspect of the method of manufacturing a semiconductor device, and the step (e) further comprises (e-1) a step of forming a barrier metal on the Schottky diode.

A fourth aspect of the method of manufacturing a semiconductor device according to the present invention is the first aspect of the method of manufacturing a semiconductor device, and the step (f) has (f-1) a step of forming an insulator on the first semiconductor layer, (f-2) a step of forming positive resist on the insulator, (f-3) a step of opening the positive resist by photolithography, and (f-4) a step of obtaining the insulator film by etching the insulator while employing the positive resist as a mask.

A fifth aspect of the method of manufacturing a semiconductor device according to the present invention is the first aspect of the method of manufacturing a semiconductor device, and the insulator film is formed by a LOCOS method in the step (f).

A first aspect of a semiconductor device protection circuit according to the present invention is a protection network protecting an insulated gate semiconductor device having a body including a control electrode and first and second current electrode currents and a detection element including a control electrode connected to the control electrode of the body and a first current electrode connected to the first current electrode of the body and a second current electrode, and characterized in that it comprises a Schottky diode having an anode connected to the control electrodes of the body and the detection element in common and a cathode, an insulated gate transistor having a first current electrode connected to the cathode, a second current electrode connected to the second current electrode of the body and a control electrode connected to the second current electrode of the detection element, and a resistor connected between the control electrode and the second current electrode of the insulated gate transistor, and the Schottky diode has no P-N junction part.

A second aspect of the semiconductor device protection circuit according to the present invention is the first aspect of the semiconductor device protection circuit, and characterized in that the Schottky diode has a semiconductor layer functioning as the cathode, a Schottky region provided in a surface of the semiconductor layer and an anode electrode electrically connected to the Schottky region, and further has a barrier metal intervening between the anode electrode and the Schottky region.

A third aspect of the semiconductor device protection circuit according to the present invention is the first aspect of the semiconductor device protection circuit, and characterized in that the Schottky diode has a semiconductor layer functioning as the cathode, a Schottky region provided in a surface of the semiconductor layer and an anode electrode provided on the Schottky region, and the anode electrode separates from the semiconductor layer as going away from the Schottky region in a plane perpendicular to the thickness direction of the semiconductor layer.

A fourth aspect of the semiconductor device protection circuit according to the present invention is the first aspect of the semiconductor device protection circuit, and characterized in that the insulated gate semiconductor device is an IGBT.

A fifth aspect of the semiconductor device protection circuit according to the present invention is the first aspect of the semiconductor device protection circuit, and characterized in that the control electrode has a trench structure.

According to the first, second and fifth to ninth aspects of the inventive semiconductor device, both of the gate electrode of the insulated gate semiconductor device and the electrode of the Schottky diode serve functions as field plates, whereby voltage resistance against a voltage becoming a reverse bias to the Schottky diode enlarges. Further, the insulator film having a taper so that both of these two electrodes serve the functions of the field plate may sufficiently be one.

According to the third aspect of the inventive semiconductor device, the electrode of the Schottky diode has the barrier metal in the portion coming into contact with the Schottky region, whereby, even if forming the anode electrode by a material having an impurity changing the conductivity type of the semiconductor substrate to the semiconductor substrate, the barrier metal prevents the impurity from being introduced into the semiconductor device, and hence no P-N junction is formed in the Schottky diode. Hence, it causes no oscillation phenomenon also when employed for the protection circuit.

According to the fourth aspect of the inventive semiconductor device, the angles of the tapers on the first and second end portions are small, whereby large voltage resistance can be obtained.

According to the first and second aspects of the inventive method of manufacturing a semiconductor device, the first aspect of the inventive semiconductor device can be obtained.

According to the third aspect of the inventive method of manufacturing a semiconductor device, the third aspect of the inventive semiconductor device can be obtained.

According to the fourth and fifth aspects of the inventive method of manufacturing a semiconductor device, the shapes of the first and second end portions of the insulator film of the first aspect of the inventive semiconductor device can be tapered.

According to the first, fourth and fifth aspects of the inventive semiconductor device protection circuit, the Schottky diode has no P-N junction part dissimilarly to a Schottky diode provided with a guard ring or a pseudo Schottky diode, whereby no oscillation phenomenon takes place when suppressing a current flowing in the body.

According to the second aspect of the inventive semiconductor device protection circuit, the barrier metal can suppress introduction of an impurity into the Schottky region and inhibit formation of a P-N junction in the Schottky diode.

According to the second aspect of the inventive semiconductor device protection network, the electrode of the Schottky diode functions as a field plate, whereby voltage resistance of the semiconductor protection network can be improved.

BRIEF DESCRIPTION OF THE DRAWINGS

The objects, features, modes and advantages of the present invention become more apparent from the following detailed description and the accompanying drawings.

FIG. 7 is a sectional view showing a part 7 in FIG. 6 in an enlarged manner.

FIG. 8 is a sectional view showing a part 8 in FIG. 6 in an enlarged manner.

FIG. 9 is a graph showing the relation between voltage resistance of the semiconductor device according to the present invention and the angle of a taper part.

DESCRIPTION OF THE PREFERRED EMBODIMENTS

Embodiment 1

Figure 1:
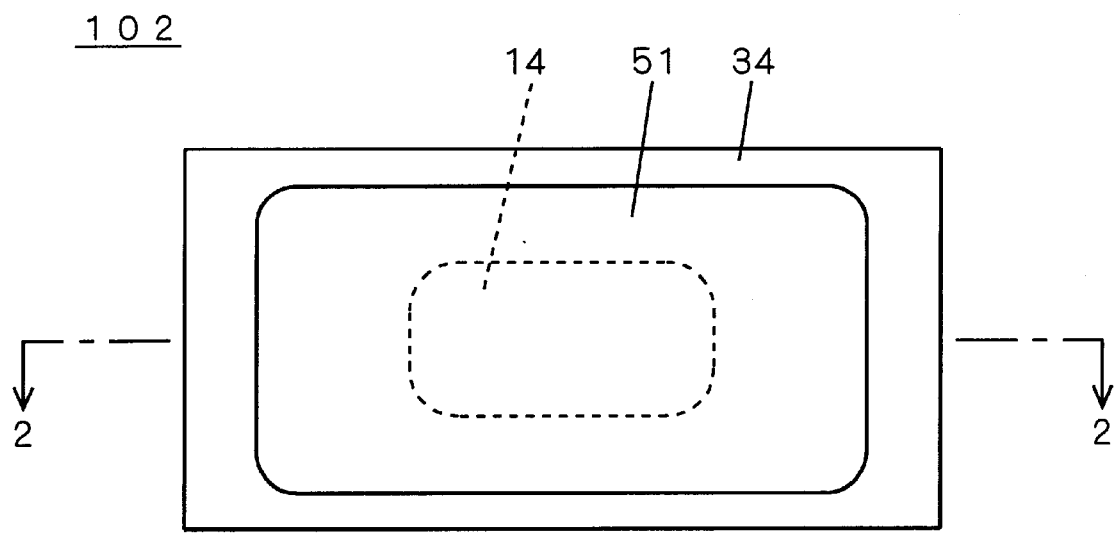
FIG. 1 is a plan view showing the structure of a Schottky diode employed in a semiconductor device according to the present invention.
Figure 2:
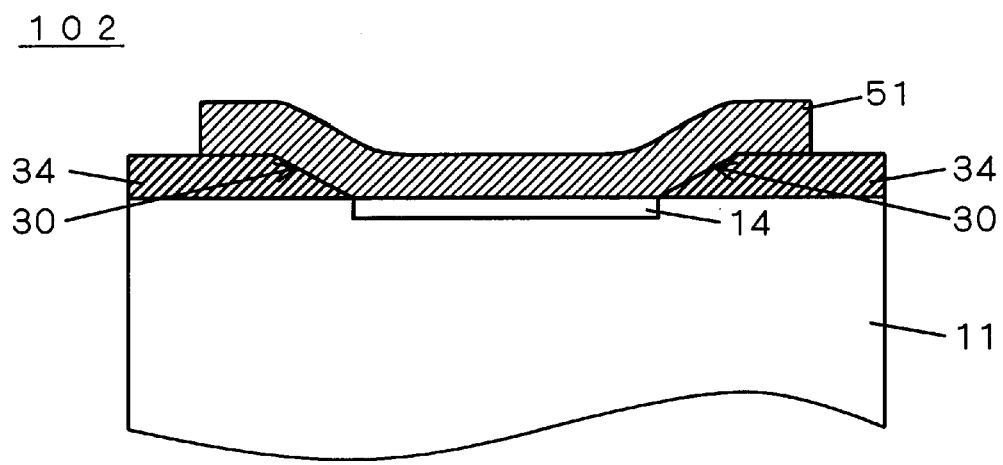
FIG. 2 is a sectional view showing a section on a cutting-plane line 2—2 of FIG. 1.

FIG. 1 is a plan view showing the structure of a Schottky diode 102 employed in a semiconductor device according to an embodiment 1 of the present invention, and FIG. 2 is a sectional view showing a section in a cutting-plane line 2—2 of FIG. 1.

An oxide film 34 is selectively annularly formed on an N⁻-type semiconductor substrate 11, and a boundary layer 14 which is a Schottky region is provided on a surface of the semiconductor substrate 11 enclosed with the oxide film 34. The boundary layer 14 can be formed by diffusing platinum, for example, into the surface of the semiconductor substrate 11. An anode electrode 51 is in contact with the boundary layer 14 and provided on its upper portion while covering part of the oxide film 34.

The oxide film 34 is annularly provided, and the shape of its inner periphery presents a taper 30. In the taper 30, the thickness of the oxide film 34 increases as separating from the inner peripheral side (the side provided with the boundary layer 14). Hence the anode electrode 51 separates from the semiconductor substrate 11 as going from the portion in contact with the boundary layer 14 to the portion covering part of the oxide film 34. The anode electrode 51 is formed up to a flat portion of the oxide film 34, i.e., a position where the shape does not present the taper 30.

Thus, the anode electrode 51 goes away from the semiconductor substrate 11 in the thickness direction of the semiconductor substrate 11 as separating from the boundary layer 14 along a plane perpendicular to the thickness of the semiconductor substrate 11, and functions as the so-called field plate. Due to such a structure, no electric field concentrates on both ends of the boundary layer 14 when a voltage becoming a reverse bias is applied between the anode electrode 51 and the semiconductor substrate 11, and hence voltage resistance of the Schottky diode 102 can be improved as compared with the Schottky diode 100. The length of the taper 30 measured along the surface of the semiconductor substrate 11 is set to at least 1 μm, for example.

A Schottky diode of such a structure that an oxide film present under an anode electrode presents a taper is disclosed in Japanese Patent Laying-Open Gazette No. 62-281366 or Japanese Patent Laying-Open Gazette No. 56-35474, for example.

The Schottky diode 102 forms no P-N junction, and hence causes no oscillation phenomenon also when employed as the Schottky diode 27 of the conventional circuit 400.

Figure 3:
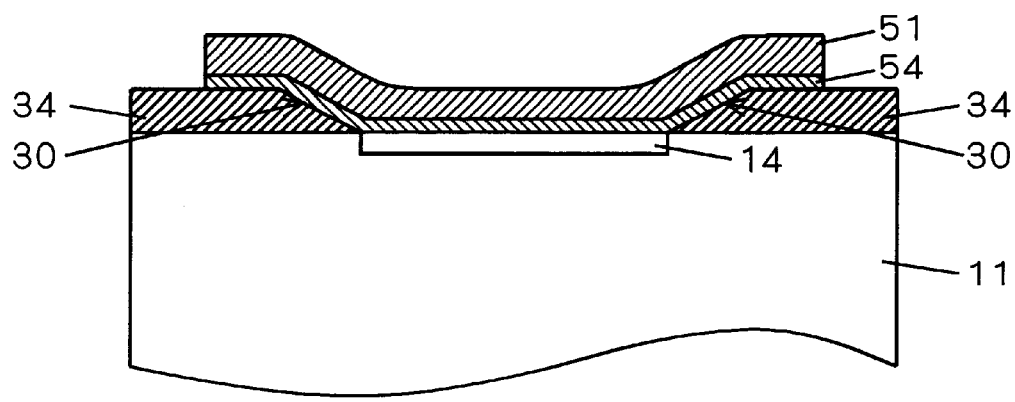
FIG. 3 is a sectional view showing the structure of another Schottky diode employed in the semiconductor device according to the present invention.

When employing an aluminum alloy as the anode electrode 51, it is desirable to intervene a barrier metal at least between the same and the boundary layer 14. In order not to form a P-N junction resulting from diffusion of aluminum such as a pseudo Schottky diode. FIG. 3 is a sectional view showing a section of a Schottky diode 103 having such a structure, and corresponds to FIG. 2. An alloy of titanium or tungsten, for example, can be employed as a barrier metal 54. A structure employing a barrier metal as the base of an electrode in a Schottky diode is disclosed in Japanese Patent Laying-Open Gazette No. 6-104424, for example.

Figure 4:
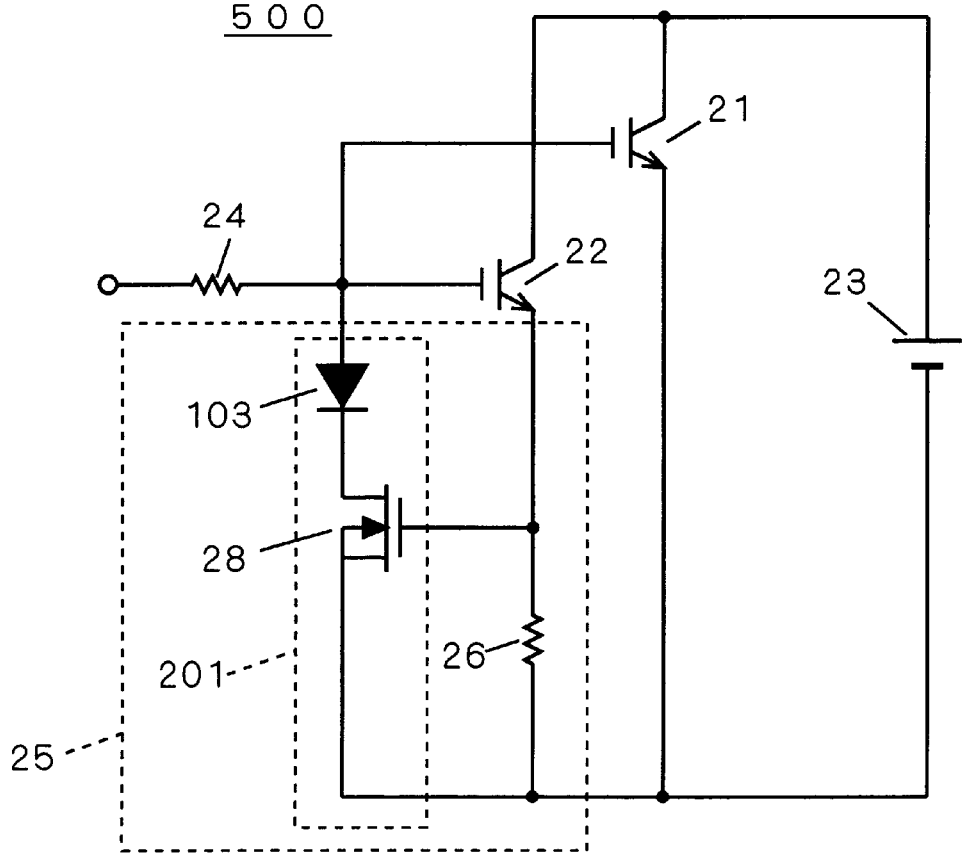
FIG. 4 is a circuit diagram showing the structure of a semiconductor device protection circuit according to the present invention.
Figure 18:
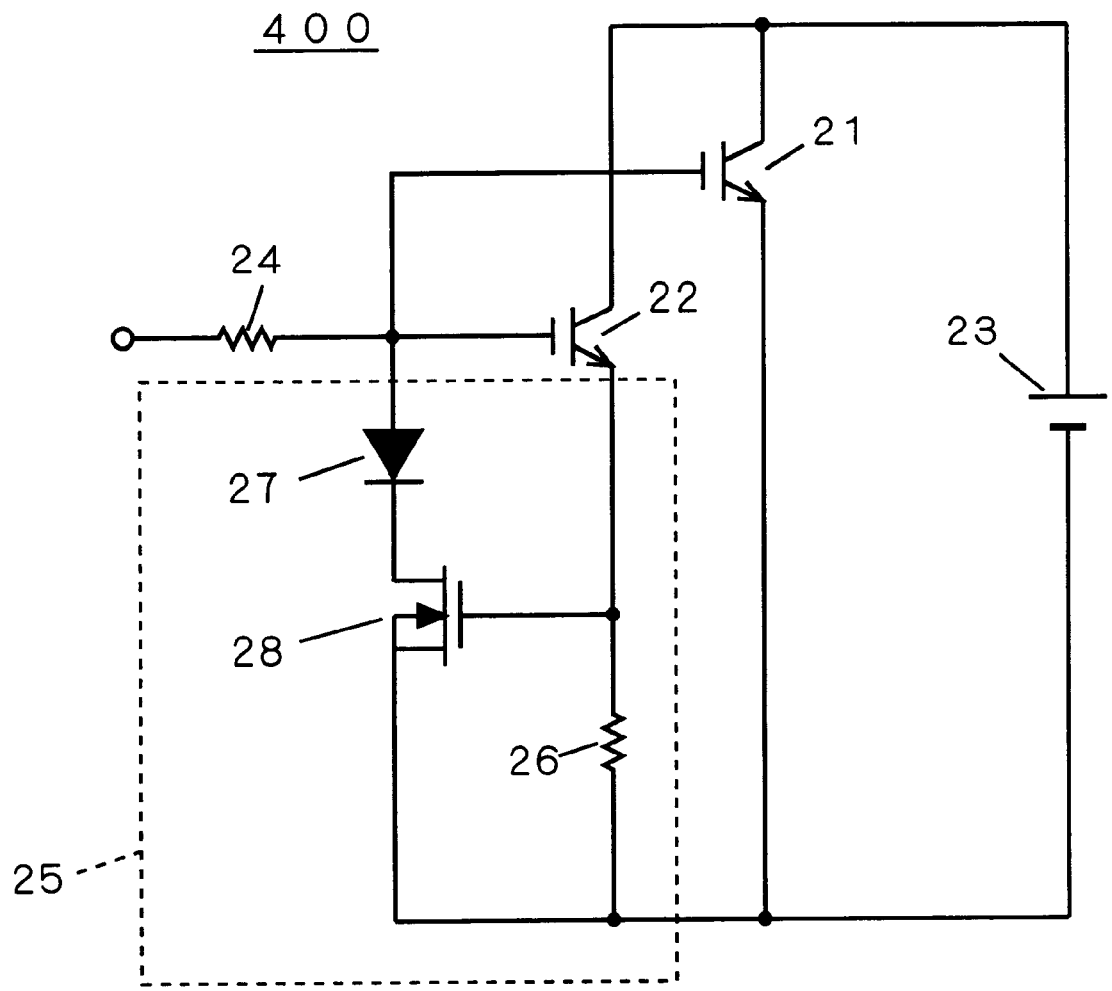
FIG. 18 is a circuit diagram showing the prior art.
Figure 19:
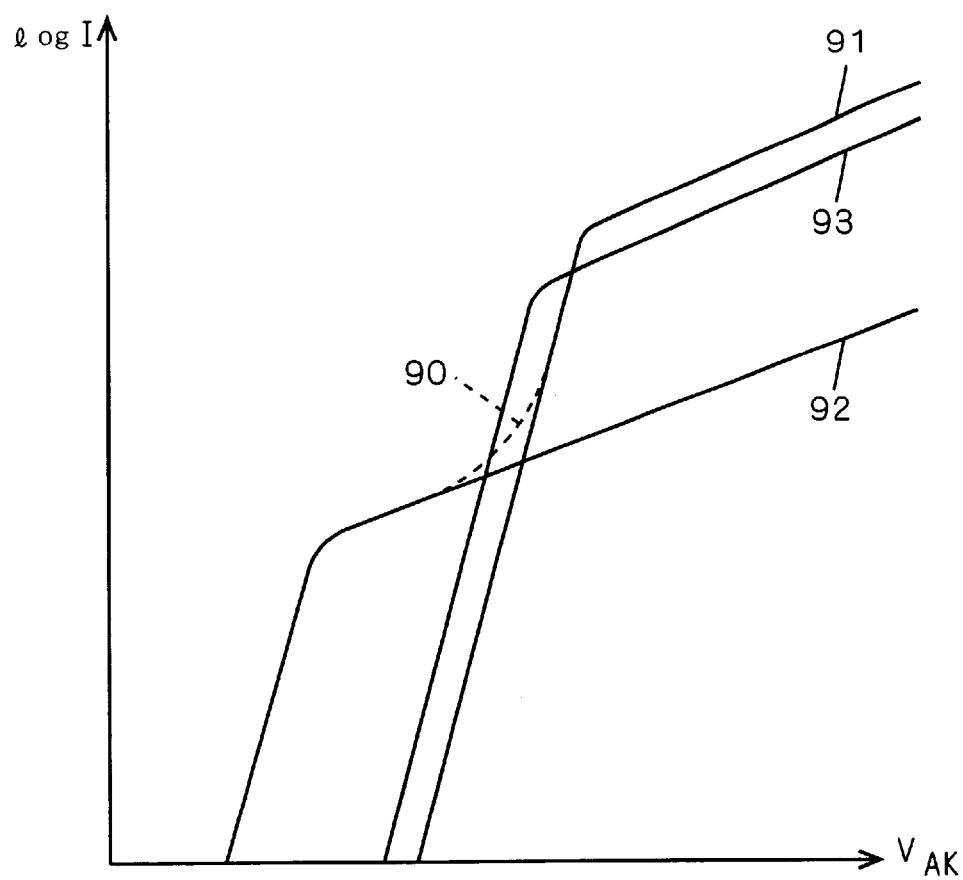
FIG. 19 to FIG. 22 are graphs showing the prior art.
Figure 20:
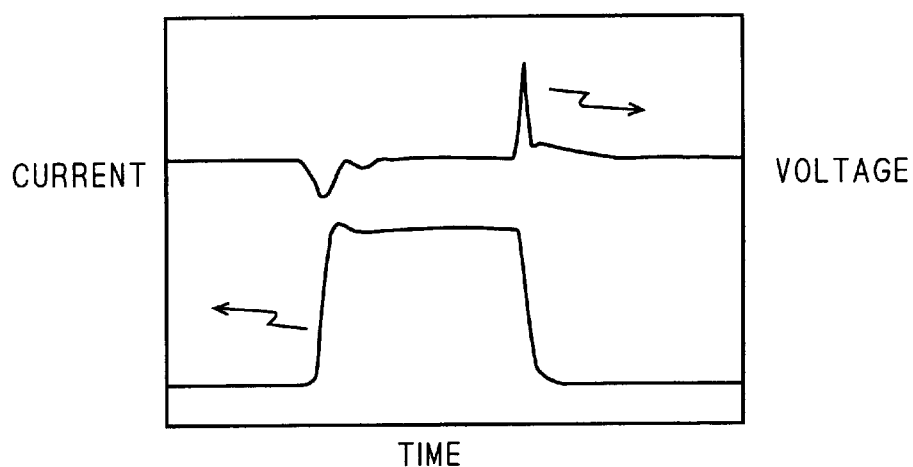

FIG. 4 is a circuit diagram corresponding to FIG. 18 and showing a circuit 500 sensing, when an overcurrent flows in an insulated gate transistor such as an IGBT 21, for example, the current and protecting the IGBT 21. The gate and the collector of a current detection IGBT 22 are connected to the gate and the collector of the IGBT 21 respectively. A power source 23 applying a voltage becoming a forward bias is provided between the collector and the emitter of the IGBT 21. An end of a resistor 24 is connected to the gates of the IGBTs 21 and 22, and the IGBTs 21 and 22 are driven under the control of a driving circuit (not shown) connected to the other end of the resistor 24.

A current detection part 25 is connected between the gate and the emitter of the IGBT 22. The current detection part 25 is formed by a resistor 26 connected between the emitter of the IGBT 22 and the emitter of the IGBT 21 and an overcurrent detection semiconductor device 201, and the overcurrent detection semiconductor device 201 is formed by a Schottky diode 103 and a MOSFET 28. The anode of the Schottky diode 103 is connected to the gates of the IGBTs 21 and 22 and the cathode is connected to the drain of the MOSFET 28 respectively. The source of the MOSFET 28 is connected to the emitter of the IGBT 21 and the gate is connected to the emitter of the IGBT 22 respectively.

Figure 5:
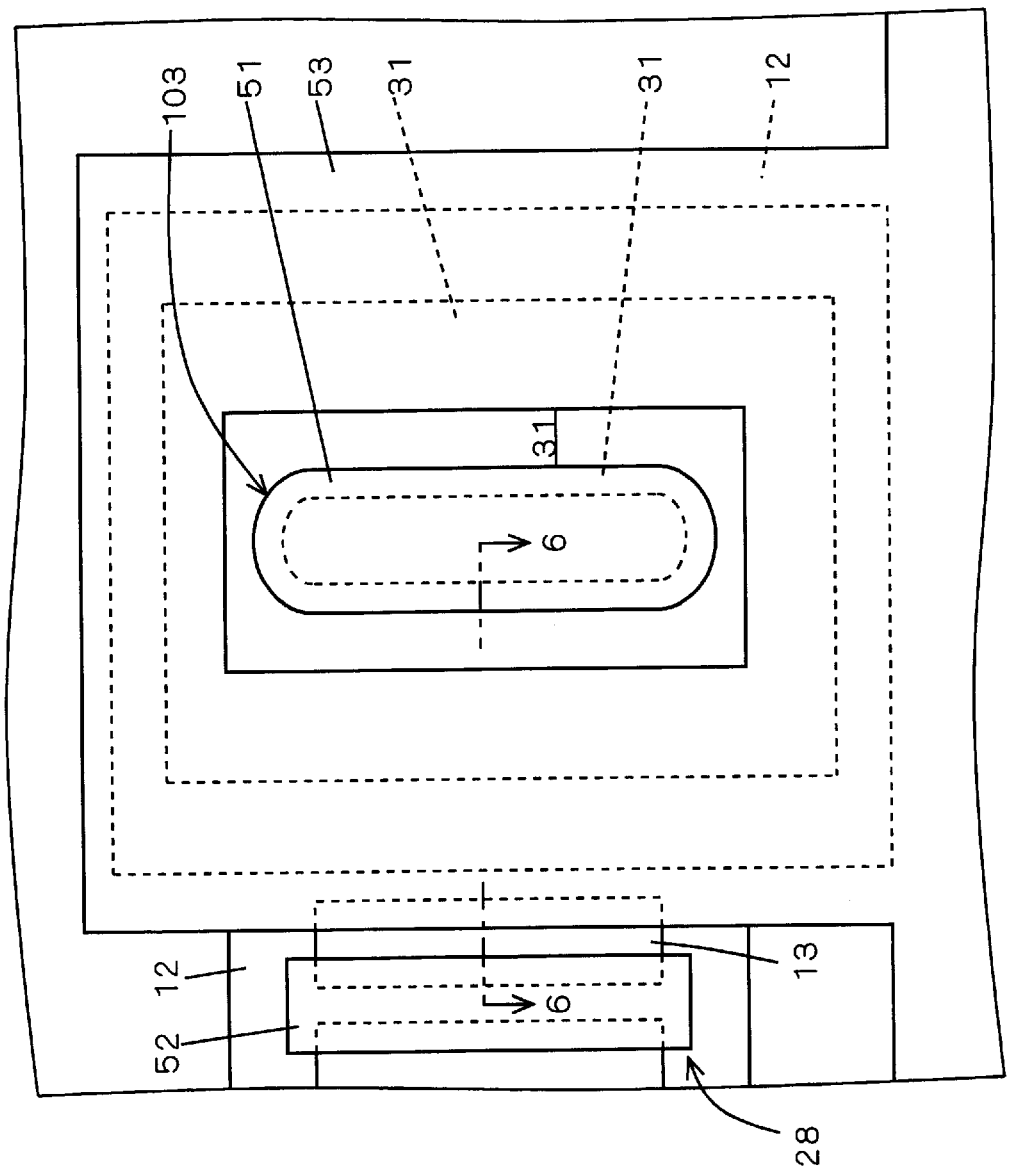
FIG. 5 is a plan view showing the structure of the semiconductor device according to the present invention.
Figure 6:
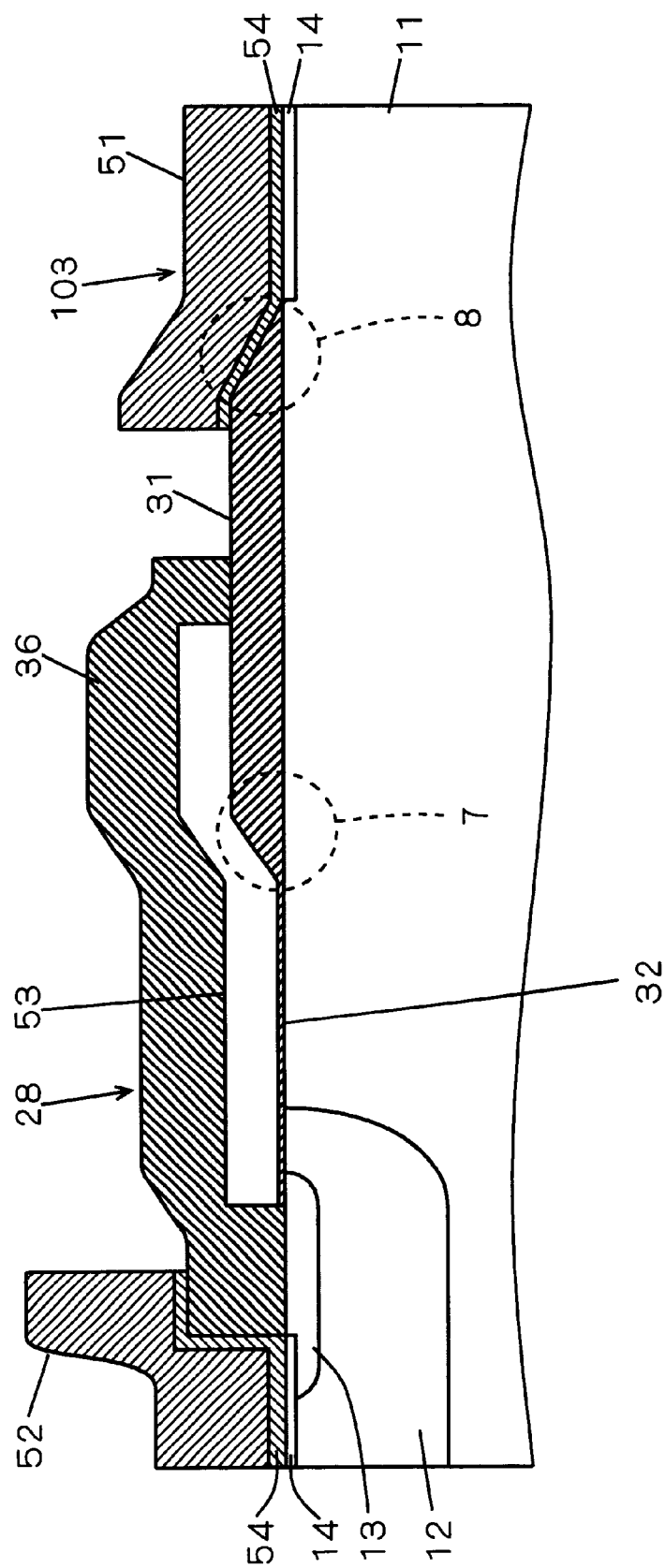
FIG. 6 is a sectional view showing a section in a partial cutting-plane line 6—6 in FIG. 5.

FIG. 5 is a plan view showing the structure of the overcurrent detection semiconductor device 201, and FIG. 6 is a sectional view showing a section in a partial cutting-plane line 6—6 in FIG. 5. Further, FIG. 7 and FIG. 8 are sectional views showing parts 7 and 8 in FIG. 6 in an enlarged manner respectively.

A P-type impurity region 12 becoming the back gate of the MOSFET 28 is selectively formed on the surface of the semiconductor substrate 11, and an N-type impurity region 13 becoming the source of the MOSFET 28 is selectively formed on a surface of the P-type impurity region 12. The N-type impurity region 13, the P-type impurity region 12 and a boundary do not come into contact with the boundary between the P-type impurity region 12 and the semiconductor substrate 11. Thus, the P-type impurity region 12 and the N-type impurity region 13 present a double diffusion structure in the semiconductor substrate 11. In order to render a portion around the surface of the P-type impurity region 12 held between the semiconductor substrate 11 and the N-type impurity region 13 a channel region, a gate oxide film 32 is formed thereon. The gate oxide film 32 is extended covering from part of a surface of the N-type impurity region 13 to part of the surface of the semiconductor substrate 11. However, the gate oxide film 32 is omitted in FIG. 5 in order to avoid complication of the figure.

An oxide film 31 thicker than the gate oxide film 32 is provided on the semiconductor substrate 11 in continuation with an end portion of the gate oxide film 32 on a side far from the P-type impurity region 12. As shown in FIG. 7 in an enlarged manner, the oxide film 31 has a taper 30a of an angle θ1 in the vicinity of the end portion of the gate oxide film 32. In the taper 30a, the thickness of the oxide film 31 enlarges as going away from the P-type impurity region 12.

A gate electrode 53 is extended up to a flat portion of the oxide film 31, i.e., a position where the shape does not present the taper 30a while covering from above the gate oxide film 32 to above the taper 30a. Therefore, the gate electrode 53 also has a function as the so-called field plate, and serves action of relaxing, in a P-N junction formed by the semiconductor substrate 11 and the P-type impurity region 12, electric field concentration in the vicinity of the respective surfaces.

An insulator film 36 covering part of the oxide film 31, all of the gate oxide film 53 and parts of the P-type impurity region 12 and the N-type impurity region 13 is provided, and a source electrode 52 coming into contact with the respective surfaces of the P-type impurity region 12 and the N-type impurity region 13, exposure of which are allowed by the insulator film 36, in common is provided. However, the insulator film 36 is omitted in FIG. 5 in order to avoid complication of the figure.

In the aforementioned manner, the MOSFET 28 is formed with the semiconductor substrate 11 as the drain, the P-type impurity region 12 as such a back gate that a channel region is formed on its surface, and the N-type impurity region 13 as the source.

On the other hand, the oxide film 31 is annularly provided and the shape of its inner periphery presents a taper 30b of an angle θ2 as shown in FIG. 8. In the taper 30b, the thickness of the oxide film 31 increases as separating from the inner peripheral side (the side provided with the boundary layer 14). In other words, it can be that the oxide film 31 encloses the boundary layer 14. It can also be that the oxide film 31 is extended from an end portion of the gate oxide film 32 on the side far from the P-type impurity region 12 up to an end portion of the boundary layer 14. An anode electrode 51 is in contact with the boundary layer 14 and provided on its upper portion while covering part of the oxide film 31. The boundary layer 14 can be formed by diffusing platinum, for example, into the surface of the semiconductor substrate 11 while employing the oxide film 31 as a mask.

In the aforementioned manner, the semiconductor substrate 11 functions as a cathode in the Schottky diode 103. When employing that such as an aluminum alloy whose component diffuses into the semiconductor substrate 11 to form a p-type impurity layer as the anode electrode 51, it is desirable to provide a barrier metal 54 as the base for the anode electrode 51 at least between the same and the boundary layer 14, as shown in FIG. 6.

As described with reference to FIG. 2, the anode electrode 51 separates from the semiconductor substrate 11 as going from the portion in contact with the boundary layer 14 to the portion covering part of the oxide film 31, and the anode electrode 51 is formed up to a flat portion of the oxide film 31, i.e., a position where the shape does not present the taper 30b. In the outer periphery of the oxide film 31, on the other hand, an end portion appearing as the left side in FIG. 5 is continuous with the gate oxide film 32, and the taper 30a is present here. In other words, the oxide film 31 has a structure making both of the gate electrode 53 of the MOSFET 28 and the anode electrode 51 of the Schottky diode 103 function as field plates. Thus, it brings two functions with one oxide film 31, and is effective for suppression of the cost.

The anode electrode 51, the source electrode 52 and the gate electrod3 53 in FIG. 6 are connected to the gates of the IGBTs 21 and 22, the emitter of the IGBT 21 and the emitter of the IGBT 22 in FIG. 4 respectively. Hence it follows that the resistor 26 is connected between the source electrode 52 and the gate electrode 53.

FIG. 9 is a graph showing the relation between voltage resistance of the overcurrent detection semiconductor device 201 and the angles of the tapers 30a and 30b. This graph shows such a case that the angles θ1 and θ2 of the tapers 30a and 30b are equally θ. Considering that voltage resistance required to the overcurrent detection semiconductor device 201 is about 30 V in general, it is understood desirable that the angles θ of the tapers 30a and 30b are smaller than 50 degrees.

Figure 21:
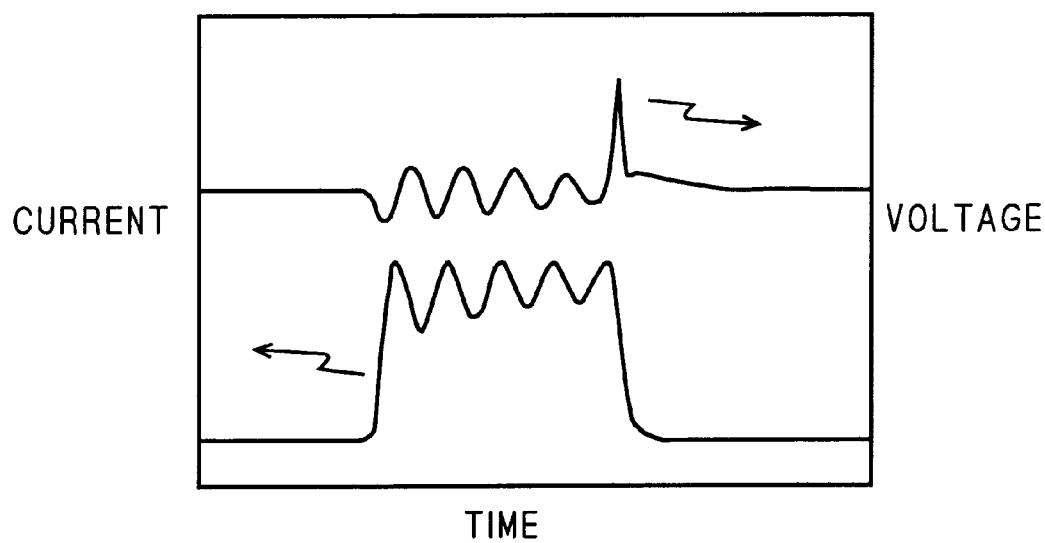
Figure 22:
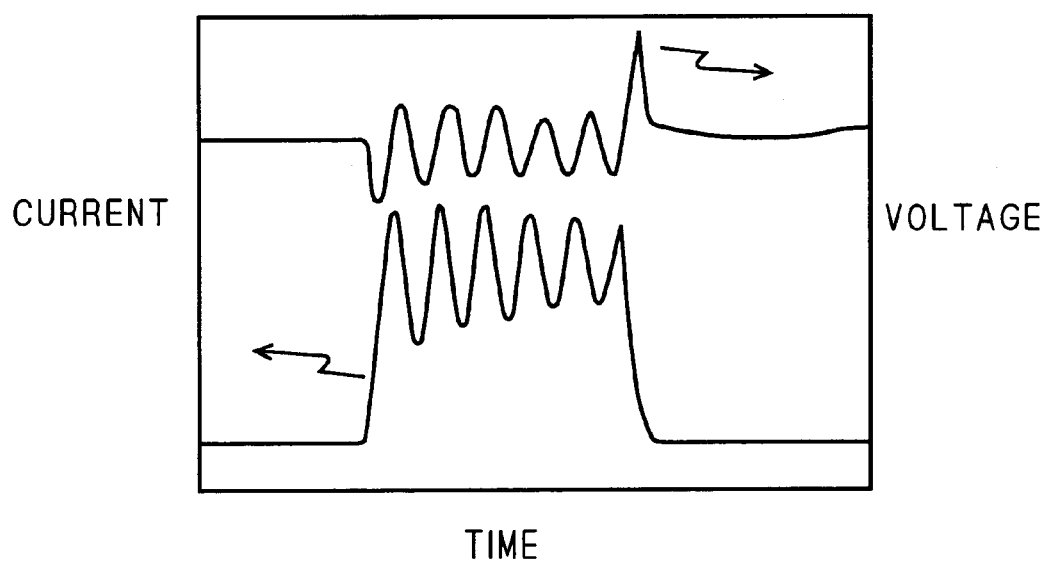

Particularly when the gate electrode of the IGBT 21 has a trench structure, the oscillation phenomenon shown in FIG. 21 and FIG. 22 becomes remarkable since the turn-on speed enlarges. Therefore, application of the present invention to an insulated gate semiconductor device comprising a gate electrode having a trench structure brings a particularly large effect.

Embodiment 2

Figure 10:
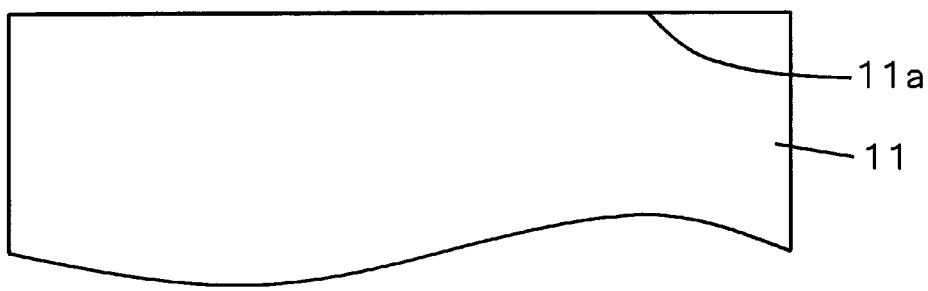
FIG. 10 to FIG. 15 are sectional views showing a method of manufacturing a semiconductor device according to the present invention in step order.
Figure 11:
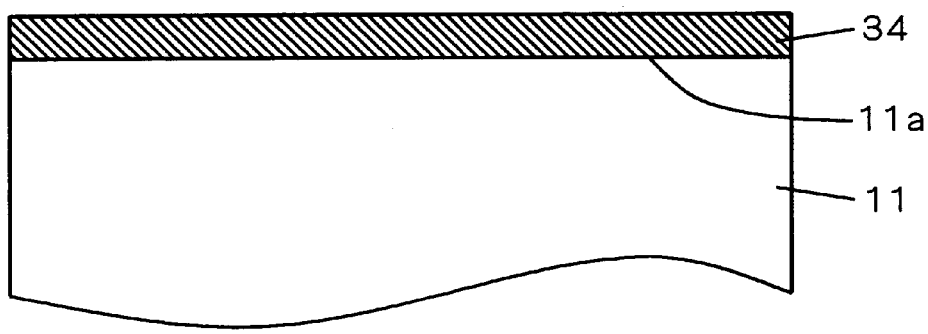

FIG. 10 to FIG. 15 are sectional views showing a method of manufacturing the Schottky diode 103 in step order. First, a semiconductor substrate 11 having a surface 11a is prepared (FIG. 10). Silicon, for example, can be exemplified as the material for the semiconductor substrate 11. Then, an oxide film 34 is provided on the surface 11a (FIG. 11). A silicon oxide film, for example, can be exemplified as the material for the oxide film 34, and it can be formed by oxidizing the surface 11a or by film formation by vapor-phase epitaxy.

Figure 12:
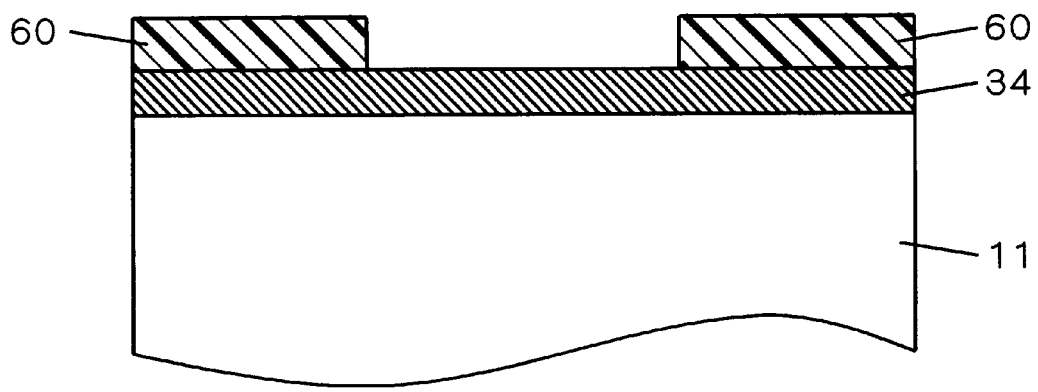
Figure 13:
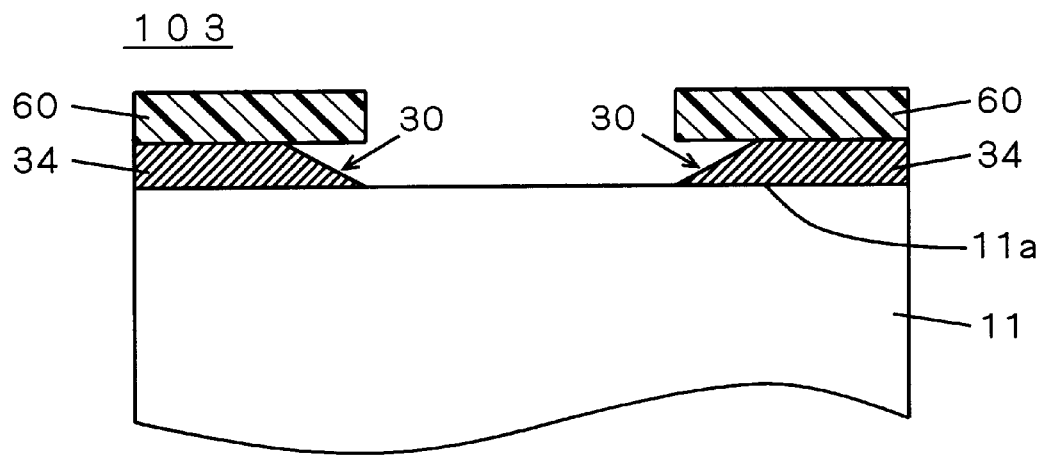

Positive resist 60 is provided on the oxide film 34, and a position to form a Schottky region is opened in this with photolithography (FIG. 12). Wet etching is performed on the oxide film 34 while employing the left positive resist 60 as a mask (FIG. 13). Etching with hydrofluoric acid is employed when employing a silicon oxide film as the oxide film 34, for example. The etched oxide film 34 remains so that the film thickness increases as going away from the opening of the positive resist 60, and a taper 30 is formed. In order to form such a taper 30, the resist becoming the etching mask for the oxide film 34 is desirably positive.

Generally in resist, a photosensitive material and an OH group of resin weakly bond by electronic affinity. By employing the positive resist as the etching mask for the oxide film 34, the left positive resist 60 is unexposed and it is conceivable that hydrophilicity of the OH group of the resin remains. Hence hydrofluoric acid readily infiltrates between the positive resist 60 and the oxide film 34, and it is conceivable that the oxide film 34 is etched also in the region having been in contact with the positive resist 60 as shown in FIG. 13. When employing negative resist as the etching mask for the oxide film 34 to the contrary, it is conceivable that left resist is already exposed and the characteristics of the OH group are lost.

Figure 14:
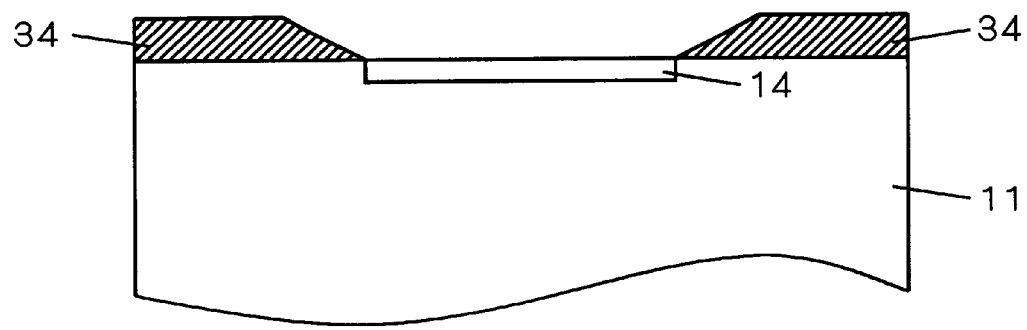
Figure 15:
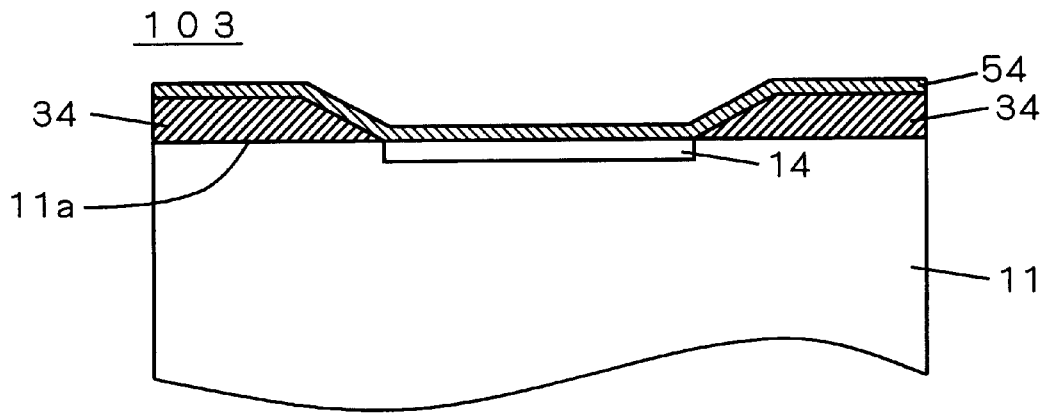
Figure 16:
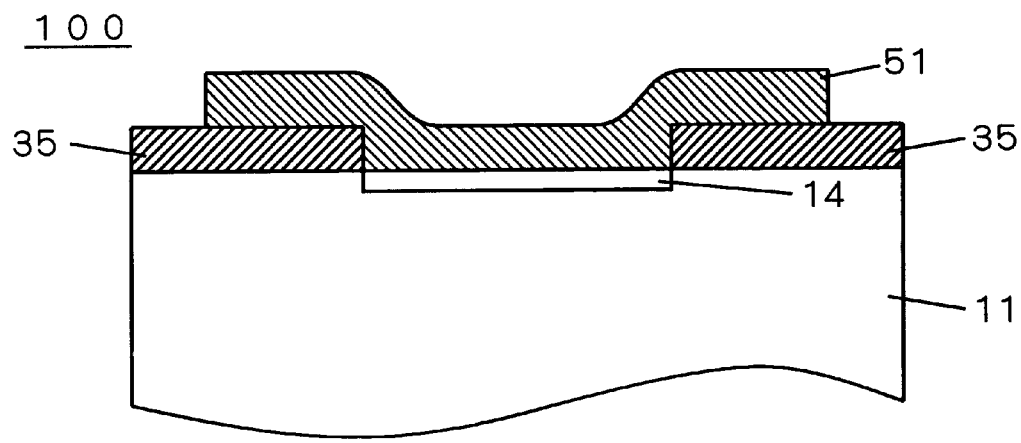
FIG. 16 and FIG. 17 are sectional views showing the prior art.
Figure 17:
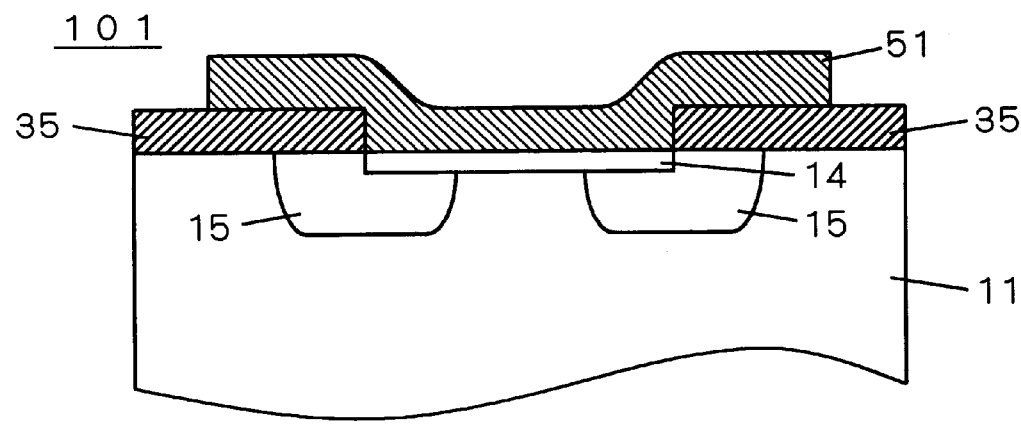

Thereafter the positive resist 60 is removed, and a boundary layer 14 being a Schottky region is formed on the surface 11a by injection of platinum ions or the like while employing the left oxide film 34 as a mask (FIG. 14). Thereafter a barrier metal 54 is provided on the boundary layer 14 and the oxide film 34 by sputtering a Ti—W alloy, for example (FIG. 15). The Schottky diode 103 shown in FIG. 3 can be obtained by further forming an anode electrode 51 on the barrier metal 54 and shaping the same.

The barrier metal 54 and the anode electrode 51 may be shaped in the same etching step after forming the barrier metal 54 on the overall surface of the structure shown in FIG. 14 and thereafter forming the anode electrode 51 on the overall surface of the barrier metal 54. If the material for the anode electrode 51 contains no material such as aluminum diffusing into the semiconductor substrate 11 and forming an impurity region, the step of forming the barrier metal 54 is unnecessary.

The oxide film 34 having the taper 30 can be formed in the aforementioned manner, and the oxide film 31 having the tapers 30a and 30b shown in FIG. 6 can be similarly formed. When forming the MOSFET 28 by employing a well-known MOSFET manufacturing method, the gate electrode 53 can be arranged also on the oxide film 31 by forming the gate electrode 53 after forming the oxide film 31 after formation of the gate oxide film 32.

The oxide films 31 and 34 can also be formed by another method as LOCOS oxide films, for example, as a matter of course. Because inclinations on bird's beaks occupied by the same can be employed as the tapers 30, 30a and 30b.

While the invention has been described in detail, the foregoing description is in all modes illustrative and the invention is not restricted thereto. It is understood that non-illustrated numerous modifications and variations can be devised without departing from the scope of the invention.

What is claimed is:

1. A semiconductor device comprising:
    a first semiconductor layer of a first conductivity type;
    an insulated gate semiconductor device having a second semiconductor layer of a second conductivity type having a surface exposed on a surface of said first semiconductor layer for functioning as a channel region, a gate insulator film provided on said first and second semiconductor layers and a gate electrode provided on said gate insulator film;
    a Schottky diode having a Schottky region formed in said surface of said first semiconductor layer and an electrode provided on said Schottky region; and
    an insulator film having a first end portion crowned with said gate electrode continuously with an end portion of said gate insulator film on a side far from said channel region with its film thickness increasing as going away from said channel region and a second end portion crowned with said electrode on an end portion of said Schottky region with its film thickness increasing as going away from said Schottky region.

2. The semiconductor device according to claim 1, wherein said first semiconductor layer functions as a drain of said insulated gate semiconductor device and a cathode of said Schottky diode.

3. The semiconductor device according to claim 1, wherein said electrode has a barrier metal on a portion coming into contact with said Schottky region.

4. The semiconductor device according to claim 1, wherein each of said first and second end portions has a taper of not more than 50 degrees.

5. The semiconductor device according to claim 1, wherein said insulator film has a flat portion between said first end portion and said second end portion
    said gate electrode is extended from said gate insulator film toward said flat portion via said first end portion, and
    said electrode is extended from said second end portion toward said flat portion.

6. The semiconductor device according to claim 1, wherein said insulator film encloses said Schottky region.

7. The semiconductor device according to claim 6, wherein said gate electrode encloses said Schottky region.

8. The semiconductor device according to claim 1, wherein said insulated gate semiconductor device is a double diffusion insulated gate semiconductor device.

9. The semiconductor device according to claim 8, wherein said insulated gate semiconductor device further has a third semiconductor layer of said first conductivity type provided in the surface of said second semiconductor layer for functioning as a source of said insulated gate semiconductor device, and
    said third semiconductor layer is connected with said gate electrode through a resistor.

10. A method of manufacturing a semiconductor device comprising:
    (a) a step of preparing a first semiconductor layer of a first conductivity type;
    (b) a step of forming a second semiconductor layer of a second conductivity type having a surface exposed on a surface of said first semiconductor layer for functioning as a channel region and a gate insulator film on said first and second semiconductor layers;
    (c) a step of forming a gate electrode on said gate insulator film for forming an insulated gate semiconductor device having said gate electrode and said first and second semiconductor layers;
    (d) a step of forming a Schottky region in said surface of said first semiconductor layer;
    (e) a step of forming an electrode on said Schottky region for forming a Schottky diode having said electrode and said Schottky region; and
    (f) a step of forming an insulator film having a first end portion whose film thickness increases as going away from said channel region in continuation with an end portion of said gate insulator film on a side far from said channel region and a second end portion whose film thickness increases as going away from said Schottky region on an end portion of said Schottky region in advance of said steps (c) and (d).

11. The method of manufacturing a semiconductor device according to claim 10, wherein said step (d) has:
    (d-1) a step of introducing an impurity into said surface of said first semiconductor layer while employing said insulator film as a mask.

12. The method of manufacturing a semiconductor device according to claim 10, wherein said step (e) further comprises:
    (e-1) a step of forming a barrier metal on said Schottky diode.

13. The method of manufacturing a semiconductor device according to claim 10, wherein said step (f) has:
    (f-1) a step of forming an insulator on said first semiconductor layer,
    (f-2) a step of forming positive resist on said insulator;
    (f-3) a step of opening said positive resist by photolithography, and
    (f-4) a step of obtaining said insulator film by etching said insulator while employing said positive resist as a mask.

14. The method of manufacturing a semiconductor device according to claim 10, wherein said insulator film is formed by a LOCOS method in said step (f).

15. A semiconductor device protection circuit protecting an insulated gate semiconductor device having a body including a control electrode and first and second current electrode currents and a detection element including a control electrode connected to said control electrode of said body and a first current electrode connected to said first current electrode of said body and a second current electrode, comprising:
    a Schottky diode having an anode connected to said control electrodes of said body and said detection element in common and a cathode;

an insulated gate transistor having a first current electrode connected to said cathode, a second current electrode connected to said second current electrode of said body and a control electrode connected to said second current electrode of said detection element; and a resistor connected between said control electrode and said second current electrode of said insulated gate transistor, said Schottky diode having no P-N junction part.

16. The semiconductor device protection circuit according to claim 15, wherein said Schottky diode has:

a semiconductor layer functioning as said cathode, a Schottky region provided in a surface of said semiconductor layer, and an anode electrode electrically connected to said Schottky region, and further has a barrier metal intervening between said anode electrode and said Schottky region.

17. The semiconductor device protection circuit according to claim 15, wherein said Schottky diode has:

a semiconductor layer functioning as said cathode, a Schottky region provided in a surface of said semiconductor layer, and an anode electrode provided on said Schottky region, and said anode electrode separates from said semiconductor layer as going away from said Schottky region in a plane perpendicular to the thickness direction of said semiconductor layer.

18. The semiconductor device protection circuit according to claim 15, wherein said insulated gate semiconductor device is an IGBT.

19. The semiconductor device protection circuit according to claim 18, wherein said control electrode has a trench structure.

* * * * *

UNITED STATES PATENT AND TRADEMARK OFFICE
CERTIFICATE OF CORRECTION

PATENT NO. : 6,423,598 B1
DATED : July 23, 2002
INVENTOR(S) : Hideki Takahashi et al.

It is certified that error appears in the above-identified patent and that said Letters Patent is hereby corrected as shown below:

<u>Title page,</u>
Item [56], References Cited, after U.S. PATENT DOCUMENTS, please add the following:
-- FOREIGN PATENT DOCUMENTS

| | | |
|---|---|---|
| 56-35474 | 4/1981 | (JP) |
| 62-281366 | 12/1987 | (JP) |
| 63-164461 | 7/1988 | (JP) |
| 6-104424 | 4/1994 | (JP) -- |

Signed and Sealed this

Ninth Day of March, 2004

JON W. DUDAS
*Acting Director of the United States Patent and Trademark Office*